United States Patent [19]

Summer

[11] Patent Number: 5,430,341
[45] Date of Patent: Jul. 4, 1995

[54] MINIATURIZED POWER SUPPLY FOR AN ELECTROACTIVE ACTUATOR

[76] Inventor: Steven Summer, 1 Roned Rd., Shirley, N.Y. 11967

[21] Appl. No.: 951,797

[22] Filed: Sep. 28, 1992

[51] Int. Cl.6 .......................................... H01L 41/08
[52] U.S. Cl. .................... 310/316; 310/317; 310/328; 363/68; 318/116
[58] Field of Search ............... 310/316, 317, 328, 366; 363/20, 21, 68; 318/116

[56] References Cited

U.S. PATENT DOCUMENTS

| | | | |
|---|---|---|---|
| 3,746,897 | 7/1973 | Karatjas | 310/316 |
| 4,258,282 | 3/1981 | Riickaert | 310/317 |
| 4,266,269 | 5/1981 | Toba | 363/68 |
| 4,370,607 | 1/1983 | Dassonville | 363/68 X |
| 4,654,775 | 3/1987 | Nero | 363/68 |
| 4,807,105 | 2/1989 | Varjasi et al. | 363/68 |
| 5,003,452 | 3/1991 | Sireul et al. | 363/68 X |

Primary Examiner—Mark O. Rudd
Attorney, Agent, or Firm—Stephen E. Feldman

[57] ABSTRACT

A circuit for providing from a low voltage input, a high voltage output to a segmented electroactive actuator, wherein each of the segments function as a filter capacitor and a load, comprising a transformer, an input switching means, input coupling means and voltage converter means. The transformer has a primary and a plurality of secondary windings, and the input coupling means couples the low voltage input to the primary winding. The input switching means is coupled to the primary winding for permitting current to flow through the primary winding. The voltage converter means is coupled to each of the secondary windings and comprises output coupling means for coupling to said filter capacitors and when so coupled, the voltage converter means provides a plurality of output voltages in series and wherein each output voltage is generated across each of the filter capacitors of the segments.

10 Claims, 1 Drawing Sheet

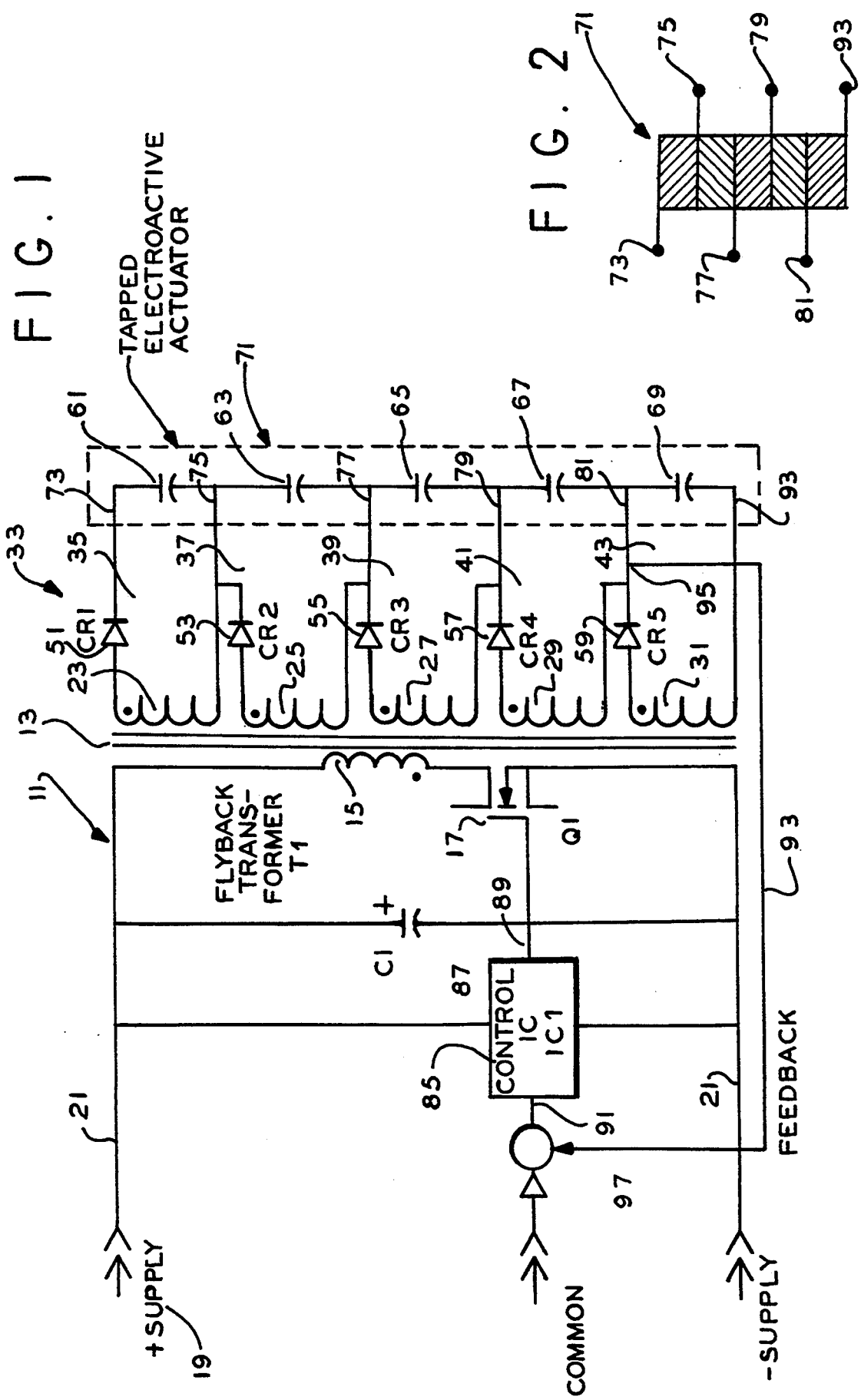

MINIATURIZED POWER SUPPLY FOR AN ELECTROACTIVE ACTUATOR

FIELD OF THE INVENTION

This invention relates to a power supply for an electroactive actuator which power supply is suited for miniaturization.

BACKGROUND OF THE INVENTION

Electroactive actuators are solid state devices which produce movement or change in dimensions when an electric potential or voltage is applied to them. These devices are constructed with multiple stacked layers of metalized dielectric material having piezoelectric or electrostatic properties.

Electroactive actuators typically require operating voltage ranging from 50 volts D.C. to 500 volts D.C., since their sensitivity of movement to applied voltages are relatively low. Since this operating level of voltage is normally not found in many applications, a D.C. to D.C. converter is commonly used to convert available voltage to the proper operating voltage required by the actuator. Frequently this operating voltage must be changed upon command, in order to produce variations in movement.

The present invention permits integration of the low voltage to high voltage D.C. to D.C. converter with the actuator. This integration results in the converter being compact in size and achieves simplicity of design.

Achieving small physical size in a power supply or D.C. to D.C. converter applications is presently commonly realized by using relatively high switching frequencies for power conversion. However, there is considerable practical difficulty in producing relatively high voltage outputs (in the range of 100 to 500 volts D.C.) from low voltage sources (in the range of 5 to 28 volts D.C.) with small physical size.

The problem in the aforesaid designs is that large step up turn ratios are required in the power supply transformer. For example, in constructing a power supply with a 5 volt D.C. input and a 300 volt D.C. output, a transformer turns ratio of approximately 60:1 would normally be required.

However, a large transformer with a high turns ratio would have large parasitic component inductances and capacitances. Such a transformer would be far from an ideal transformer. A large portion of the input power goes into energy stored in these parasitic components. When driven with a rectangular waveform, such a transformer tends to produce a rounded, or sinusoidal output. Although it is possible to work around these resonant effects, the results is that the transformer is physically larger than would be otherwise, since it is also storing considerable energy in the parasitic inductances and capacitances.

In the topology described hereinafter, and depicted in the present invention, the aforedescribed effect of poor coupling is mitigated, allowing the compact construction of electroactive actuators.

Furthermore, in the present invention, the electroactive actuator itself is used as an integral circuit element. This permits additional miniaturization. Instead of using a discrete capacitor, the electroactive actuator is tapped or segmented, and used as a filter capacitor. Conventional connections to the interior layers of the actuator permit such usage.

SUMMARY OF THE INVENTION

The present invention is directed to a circuit for providing from a low voltage input, a high voltage output to a segmented electroactive actuator, wherein each of the segments function as a filter capacitor and a load, comprising a transformer, an input switching means, input coupling means and voltage converter means. The transformer has a primary and a plurality of secondary windings, and the input coupling means couples the low voltage input to the primary winding. The input switching means is coupled to the primary winding for permitting current to flow through the primary winding. The voltage converter means is coupled to each of the secondary windings and comprises output coupling means for coupling to said filter capacitors and when so coupled, the voltage converter means provides a plurality of output voltages in series and wherein each output voltage is generated across each of the filter capacitors of the segments.

OBJECTS OF THE INVENTIONS

A principal object of the invention is to provide a power supply for an electroactive actuator which power supply is topology suited for miniaturization.

Another object of the invention is to provide a compact high voltage power supply for a electroactive actuator having reduced parasitic effects.

A further object of the invention is to provide a compact high voltage power supply for an electroactive actuator which uses as components thereof the inherent capacitance of the electroactive actuator.

A still further object of the invention is to provide a power supply of the type described hereinabove which is especially suited for miniature surface mount or thick film hybrid form.

These and other objects and advantages of the invention will be apparent upon reading the following description in conjunction with the drawing.

BRIEF DESCRIPTION OF THE DRAWING

FIG. 1 is a schematic diagram of the circuit for producing a high voltage output across an electroactive actuator from a low voltage input constructed in accordance with the invention.

DESCRIPTION OF THE PREFERRED EMBODIMENT

Referring to the drawing, a circuit for producing a high voltage output across an electroactive actuator from a low voltage input is generally designated by reference numeral 11. A typical application of the invention is described wherein an input voltage of 10 volts D.C. is converted to a variable voltage ranging from zero to 300 volts D.C. A flyback type transformer 13 is poled as indicated and has a primary winding 15 connected in series to an input switching means 17, such as a conventional FET, to a low voltage D.C. input supply 19 through leads or coupling means 21. The input switching means 17, when energized, permits current to flow from said input supply 19 through said primary winding 15 and said switching means 17. The transformer 13 also includes a plurality, five in number, of identical secondary windings 23, 25, 27, 29 and 31. Voltage converter means 33 comprising a plurality, five in number, of individual voltage converter circuits 35, 37, 39, 41 and 43, which are coupled across each of said plurality of secondary windings 23, 25, 27, 29 and 31.

Each voltage converter circuit 35, 37, 39, 41 and 49 comprises a unidirectional current means or diode 51, 53, 55, 57 and 59, respectively, and a filter capacitor 61, 63, 65, 67 and 69.

The output voltages produced or generated across the capacitors 61, 63, 65, 67 and 69 of the voltage convertor means 33 are of the same polarity and in series with each other. An electroactive actuator 71 which is segmented or tapped, through output coupling means or connections 73, 75, 77, 79 and 81, to interior layers of the actuator 71, provides integral filter capacitors 61, 63, 65, 67 and 69, respectively, for the plurality of voltage converter circuits 35, 37, 39, 41 and 43, respectively, and serves as the load for the circuit 11. A conventual pulse width modulation or control circuit 85 having an input, output and control terminals 87, 89 and 91, respectively, has its input terminals 87 coupled to the low input voltage source 19 and its output terminal 89 coupled to the input or gate terminal of said FET 17. An output voltage regulating means 93 having an input and output terminal 95 and 97, respectively, is coupled at its input terminal 95 through a sampling resistive voltage divider (not shown) coupled across the output voltage across the load 71 or through a sampling resistive voltage divider (not shown) coupled across the output voltage across one voltage converter circuit, converter circuit 43 as shown, and its output terminal 97 is coupled to the control terminal 91 of the pulse width control circuit 85.

In operation the low voltage supply 19, such as 10 volts D.C., is applied across pulse width modulation circuit 85 which has its output 89 coupled to the gate of FET 17 and drives it at a high frequency, such as 200 kHz. The FET 17 operates as a power switch and when it is in the conducting or ON state, permits current to flow through the primary winding 15 of the flyback power transformer 13 from the input supply 19. Since the power transformer 13 operates in the flyback mode, energy is put into the primary winding 15 when the FET 17 is ON, and released from the secondaries 23, 25, 27, 29 and 31 when the FET is OFF. In the preferred embodiment the flyback transformer 13 is constructed with a total of five isolated secondary windings 23, 25, 27, 29 and 31. Each of these secondary windings have a 6:1 step up from the primary 15. Each of the voltages produced across each of the secondary windings 23, 25, 27, 29 and 31 is rectified by diodes 51, 53, 55, 57 and 59, respectively, and peak filtered by the capacitor 61, 63, 65, 67 and 69, respectively, of the five voltage converter circuits 35, 37, 39, 41 and 43, respectively. Since the rectified voltages produced across the series connected filter capacitors 61, 63, 65, 67 and 69 of the segmented electroactive actuator 71 are additive, a voltage of 60 volts D.C. is produced across each voltage converter circuit ($6 \times 10$), and a total of 300 volts D.C. is produced across the electroactive actuator load 71. This conversion involves a 30:1 ratio, and as noted previously the flyback transformer 13 does not have a 30:1 turns ratio. Utilization of five isolated secondaries, each secondary having a 6:1 step up turn ratio from the primary 15, reduces parasitic effects by a factor of approximately 25 as compared to a single series connected secondary having such 30:1 turns ratio. Also an additional benefit is that the voltage stress on the output rectifiers of the voltage converter circuits is reduced in two ways; firstly by the reduced voltage due to the use of lower turn ratios; secondly by reduced voltage due to lower parasitic components that would otherwise generate overshoot waveforms. These benefits would not be achieved if the five sets of secondaries were just connected in series prior to rectification.

Regulation of the output voltage across the electroactive actuator 71 is conventionally achieved by the use of a resistive output voltage divider (not shown) connected across the last voltage converter circuit 43 which samples the output voltage across one voltage converter circuit and feeds the sampled voltage over a feedback loop 93 back to the pulse width modulation circuit 85. Galvanic isolation in the feedback loop 93 and between the input and output is achieved by conventionally comparing the sampled output voltage to a reference voltage and then generating an error or command signal to the control terminal 91 of the pulse width modulation circuit 85 which in turn controls the flyback duty cycle. By controlling the flyback duty cycle, the pulse width modulation circuit 85 is able to maintain a variable output voltage which is proportional to the command signal fed to the FET 17. This produces a displacement proportional to the command signal voltage. The resultant D.C. voltage outputs across each tapped electroactive actuator segment produces a total displacement that is the sum of the individual displacements.

The invention has been described in detail with particular reference to the single embodiment thereof, but it will be understood that variations and modifications can be effected within the spirit and scope of the invention.

What is claimed is:

1. A circuit for providing from a low voltage input, a high voltage output to a segmented electroactive actuator, each of which segments function as a filter capacitor and a load, comprising:

a transformer having a primary winding;

an input switching means;

an input coupling means for coupling said low voltage input to said primary winding, said input switching means coupled to said primary winding for permitting current to flow through said primary winding;

said transformer having a plurality of secondary windings; and voltage converter means coupled to each of said plurality of secondary windings, said voltage converter means comprising output coupling means for coupling to said filter capacitors, said voltage converter means, when connected to said filter capacitors, for providing a plurality of equal output voltages of the same frequency in series with each other, each of said output voltages of said plurality of output voltages generated across each of said filter capacitors of said segments.

2. The circuit as recited in claim 1, further comprising a pulse width control circuit having input, output and control terminals, said input terminal coupled to said low voltage input and said output terminal coupled to said input switching means.

3. The circuit as recited in claim 1, wherein said input switching means provides a flyback mode of operation for said transformer.

4. The circuit as recited in claim 2, further comprising output voltage regulating means having input and output terminals, said input terminal coupled to the output terminal of one of said voltage converter means, said output terminal coupled to the control terminal of said pulse width control circuit.

5. The circuit as recited in claim 1, wherein said input switching means is coupled in series with said primary winding of said trans former.

6. The circuit as recited in claim 1, wherein said voltage converter means comprises a plurality of voltage converter circuits, and wherein individual voltage converter circuits are coupled to individual secondary windings.

7. The circuit as recited in claim 6, wherein each of said voltage converter circuits comprise unidirectional current means.

8. The circuit as recited in claim 7, wherein individual secondary windings, unidirectional current means, and each of said output coupling means when connected to said filter capacitors are coupled in series relationship with each other.

9. The circuit as recited in claim 8, wherein said filter capacitors are coupled in series relationships with each other when said output coupling means are connected thereto.

10. The circuit as recited in claim 1, wherein said input switching means provides a flyback mode of operation for said transformer and is coupled in series with said primary winding of said transformer, and wherein each filter capacitor of each of said segments are coupled in series relationship with each other filter capacitor.

* * * * *